United States Patent [19]

MacKenzie

[11] 4,194,119
[45] Mar. 18, 1980

[54] SELF-ADJUSTING CRYOGENIC THERMAL INTERFACE ASSEMBLY

[75] Inventor: Ronald MacKenzie, Newport Beach, Calif.

[73] Assignee: Ford Motor Company, Dearborn, Mich.

[21] Appl. No.: 855,844

[22] Filed: Nov. 30, 1977

[51] Int. Cl.² .............................................. G01J 1/00
[52] U.S. Cl. ................................. 250/352; 62/514 R; 165/81; 165/185
[58] Field of Search ............... 250/338, 352; 136/221, 136/229; 62/514 R, 514 JT; 165/185, 81, 69

[56] References Cited
U.S. PATENT DOCUMENTS

| | | | |
|---|---|---|---|
| 2,951,944 | 9/1960 | Fong | 250/352 |
| 3,006,157 | 10/1961 | Haettinger et al. | 250/352 |
| 3,063,260 | 11/1962 | Dennis | 250/352 |
| 3,225,820 | 12/1965 | Riordan | 165/26 |
| 3,258,602 | 6/1966 | Promish | 250/352 |
| 3,435,137 | 3/1969 | Altshuler et al. | 250/352 |
| 3,807,188 | 4/1974 | Lagodmos | 62/514 |
| 3,889,119 | 6/1975 | Whicker et al. | 250/352 |
| 3,999,403 | 12/1976 | Bower et al. | 165/185 |
| 4,043,835 | 8/1977 | Hall | 136/221 |

Primary Examiner—Alfred E. Smith
Assistant Examiner—Carolyn E. Fields
Attorney, Agent, or Firm—Paul K. Godwin, Jr.; Clifford L. Sadler

[57] ABSTRACT

An assembly for transferring heat at cryogenic temperatures across an interface space between a relatively fixed refrigerated cold finger and a relatively movable Dewar vacuum flask having an infrared detector array mounted therein. The interface assembly is formed of two opposing thermal conducting plates which are spring loaded so as to be in intimate contact with both the end face of the cold finger and a face of the opposite side of the mounting element for the detector array in the Dewar vacuum flask. A flexible thermal conductor element surrounds the spring and is securely connected to the opposing plates to complete the thermal conduction path between the flask and the cold finger. A first preferred embodiment of the assembly utilizes a bellows shaped flexible thermal conductor which allows the plates to make intimate contact with their corresponding faces even though the faces may be oriented in non-parallel configurations. The second embodiment of the assembly utilizes a helical wound coil of thermal conductor which also allows the plates to reorient themselves as necessary to make intimate contact with the corresponding faces.

10 Claims, 3 Drawing Figures

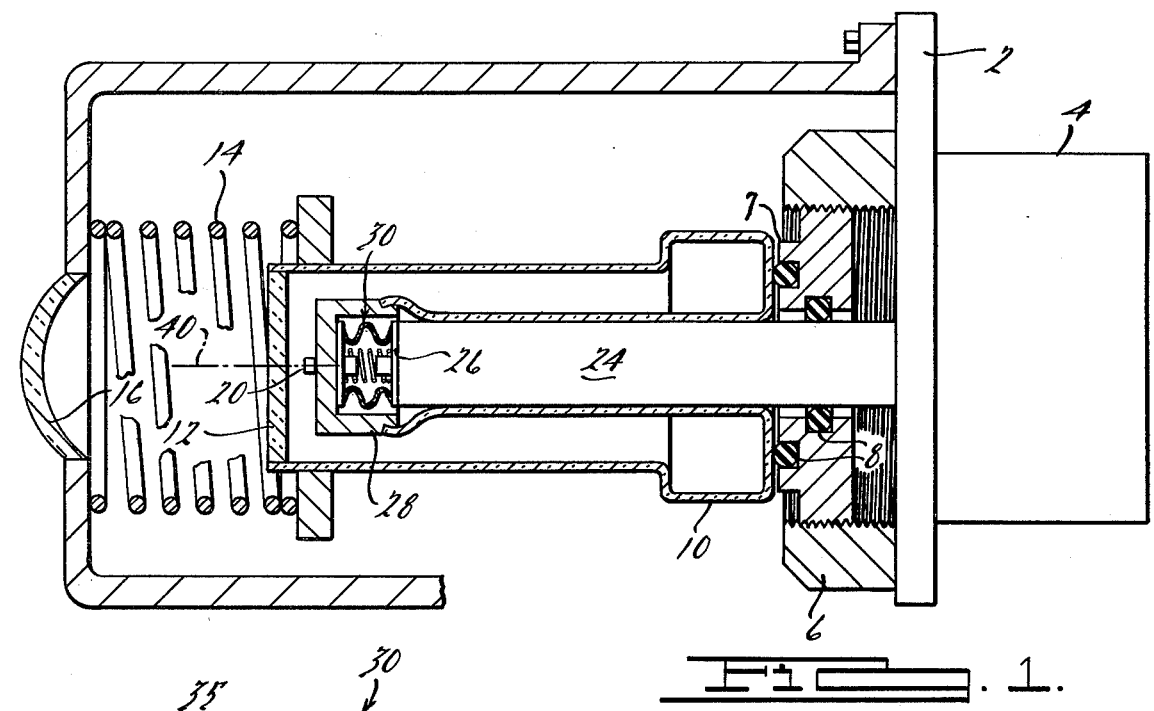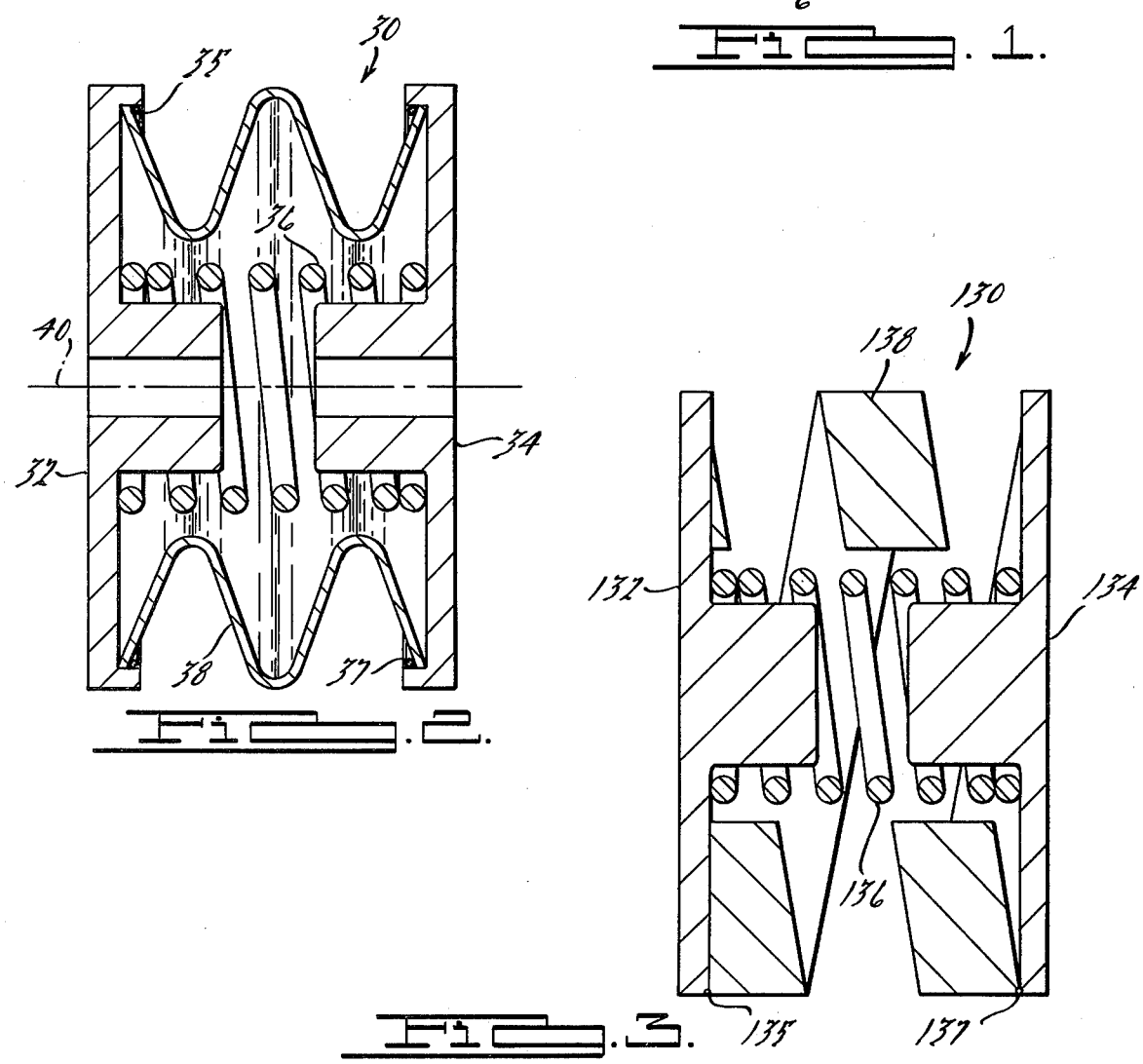

SELF-ADJUSTING CRYOGENIC THERMAL INTERFACE ASSEMBLY

BACKGROUND OF THE INVENTION

1. Field of the Invention

The present invention is directed to a thermal coupling device which flexibly interfaces between a heat source and a heat sink.

2. Description of the Prior Art

Thermal coupling between a cryogenic refrigerator having a relatively fixed cold finger extending therefrom and a heat producing source such as an infrared detector is necessary in order to maintain the source at a predetermined temperature. Assemblies have been constructed which interface between a detector heat source and the cold finger sink and allow for misalignment so that the detector may be reoriented for optimum focus or tracking.

A prior art attempt to construct a coupling device is shown in U.S. Pat. No. 3,807,188. A coupling between a refrigeration source and a device to be refrigerated is mechanically accomplished at room temperature by a liquid metal-filled bellows between the refrigeration source and the device. In that coupling device, misalignment adjustments between the refrigerated cold finger and the movable detector must be made at room temperature. Thereafter, the cold finger is cryogenically cooled and the liquid metal-filled bellows freezes to provide the inter-engaging clamping force and the conductive thermal coupling.

In U.S. Pat. No. 3,889,119 a cryogenic cooler is described for an infrared receiver. A heat transfer mechanism is also shown which utilizes a flexible heat transfer strip connected between the end of a cold finger and a flanged member which abuts against the detector-vacuum module upon which the infrared detector is mounted. A biasing spring is also disclosed which surrounds the strip to bias the flanged member into engagement with the detector-vacuum module.

SUMMARY OF THE INVENTION

The present invention attempts to overcome the problems of the prior art by providing a self-adjusting thermal interface assembly which maintains a predetermined temperature differential between the end of a cold finger and an infrared detector even though the end face of the cold finger and the surface mount for the infrared detector are in a non-parallel configuration. Furthermore, the present invention maintains the predetermined temperature differential with a fixed length thermal conduction path which allows reorientation between the relatively fixed cold finger and the adjustable detector mounting surface even at cryogenic temperatures.

The interface assembly is formed of two opposing thermal conducting plates which are spring loaded so as to be in intimate contact with both the end face of the cold finger and a face of the opposite side of the mounting element for the detector array in the Dewar vacuum flask. A flexible thermal conductor element surrounds the spring and is securely connected to the opposing plates to complete the thermal conduction path between the flask and the cold finger. A first preferred embodiment of the assembly utilizes a bellows shaped flexible thermal conductor which allows the plates to make intimate contact with their corresponding faces even though the faces may be oriented in non-parallel configurations. The second embodiment of the assembly utilizes a helical wound coil of thermal conductor which also allows the plates to reorient themselves as necessary to make intimate contact with the corresponding faces.

It is, therefore, an object of the present invention to provide a cryogenic thermal interface assembly which presents a fixed thermal conduction path while at the same time being self-adjustable to accommodate non-parallel surfaces of a heat source and a heat sink which are being interfaced.

It is another object of the present invention to provide a thermal interface assembly which maintains contact between a heat source and a heat sink while adjustments are made relating to their separation and relative orientation at cryogenic temperatures.

BRIEF DESCRIPTION OF THE DRAWINGS

FIG. 1 illustrates a partial cross-section of a typical infrared imaging sensor of the type employing the present invention.

FIG. 2 is a detailed drawing of a first embodiment of the present invention.

FIG. 3 is a detailed drawing of a second embodiment of the present invention.

DESCRIPTION OF THE PREFERRED EMBODIMENTS

FIG. 1 illustrates, in partial cross-section, an infrared imaging sensor. The imaging sensor comprises a mounting flange 2 upon which a housing is permanently mounted to enclose the detector portion of the sensor. A lens 16 is mounted on the housing to focus the infrared image through an infrared window 12 onto an infrared detector array 20. The infrared detector array 20 is contained within a Dewar vacuum assembly 10 which is substantially constructed of glass. A mounting surface 28 is provided as part of the Dewar vacuum assembly 10 construction to provide a thermal conducting path between the detector array 20 and a thermal interface assembly 30. A cold finger 24 is attached to a cryogenic refrigerator 4 which is mounted on the mounting flange 2 in a relatively fixed position. The cold finger 24 has an end face 26 and acts as a heat sink.

In operation, the end face 26 of the cold finger 24 is maintained at approximately 77° K. and the infrared detector array is ideally maintained at approximately 80° K. Therefore, it is critical that the thermal interface assembly 30 maintain a constant differential temperature of approximately 3° K. between those two elements.

It has been found that optimum focusing of the infrared image onto the detector array 20 is achieved when the system is cooled to the cryogenic temperatures. Therefore, the interface assembly 30, although having a relatively fixed thermal path length, maintains its flexibility and intimate thermal contact with the surface 28 and the end face 26 during focusing at the cryogenic temperatures.

To achieve focusing, an internally threaded support element 6 is attached to the mounting flange 2 and surrounds the cold finger 24. An externally threaded annular focus adjust element 7 is mounted in the support 6 and is translated along the axis 40 by rotation therein. O-rings 8 are mounted in the annular element 7 to respectively contact the cold finger 24 and the vacuum Dewar flask 10. The Dewar flask 10 is biased against one of the O-rings 8 of the focusing element 7 by a compression spring 14.

As the focus adjust element 7 is rotated, the Dewar flask 10 is translated along the axis 40 to thereby relocate the detector array 20 with respect to the focused image. Additional adjustments may also be made to the Dewar flask to compensate for azimuth rotation or array alignment with the optical system without altering the effectiveness of the thermal interface assembly.

A first embodiment of the thermal interface assembly 30 is detailed in FIG. 2. In this assembly, a first end plate 32 is formed of a thermally conducting material and has an outer surface which is designed to make intimate contact with the detector mounting surface 28 of the Dewar flask 10. The assembly 30 also includes a second thermally conducting plate 34 designed to make intimate contact with the end face 26 of the cold finger 24. A compression spring 36 is centrally mounted between the plates 32 and 34 to bias those plates outwardly so that they may make intimate contact with the corresponding surfaces, even when those surfaces are not parallel. In the first embodiment, the thermal conduction path is completed by a flexible cylindrical bellows 38 which is formed of a thermally conducting material surrounding the coil spring 36 and is affixed to the end plates 32 and 34 by respective solder joints 35 and 37.

It has been found that material such as silver, gold, copper and beryllium are well suited to form the bellows 38, due to their high thermal conductivity properties and flexibility at low temperatures.

As mentioned above, it is preferred that fine focusing be performed while the detector array 20 is at its cryogenic operating temperature. Of course, this necessitates that the thermal interface be flexible enough to be compressed or expanded along the axis 40. Another reason for providing the flexible thermal conduction path is to isolate any vibration which may otherwise be transmitted from the refrigerator unit 4 along the cold finger 24. Such vibration may cause electrical noise in the detector array 20 and cause image quality deterioration or mechanical failure of the detector array 20. Therefore, the flexible interface assembly such as shown in the present invention provides for vibration isolation.

Furthermore, it is known that, in the manufacture of the Dewar flask assemblies, it is difficult to guarantee that the mounting surface 28 will be formed so as to be parallel with the end face 26 of the cold finger 24 when they are assembled. Therefore, it is important that the thermal interface assembly be flexible enough to make intimate contact with the corresponding surfaces, whether they are parallel or not.

The second embodiment of the present invention is shown in FIG. 3 and is designated as assembly 130. In this assembly, a first end plate 132 corresponds to the end plate 32 in FIG. 2 and a second end plate 134 corresponds to the end plate 34 in FIG. 2. The end plates 132 and 134 are biased outwardly by a compression spring 136 and the thermally conducting path between the end plates 132 and 134 is completed by the heat conducting material 138 surrounding the compression spring 136. In this case, the heat conducting path 138 is a helical coil having a generally rectangular cross-section which is soldered to the end plates 132 and 134. As in the first embodiment, the second embodiment shown in FIG. 3 allows the end plates 132 and 134 to be expanded or contracted while maintaining a fixed thermal conduction path and a predetermined differential temperature to be maintained across the end plates 132 and 134. In addition, the second embodiment also allows for the end plates 132 and 134 to maintain intimate contact with their corresponding heat source and heat sink surfaces whether those surfaces are parallel or not.

It will be apparent that many modifications and variations may be effected without departing from the scope of the novel concept of this invention. Therefore, it is intended by the appended claims to cover all such modifications and variations which fall within the spirit and scope of the invention.

I claim:

1. A compressible thermal interface assembly for providing a predetermined heat conducting path between a reorientable heat source having a flat surface and a relatively fixed heat sink having a flat surface comprising:
   a first heat conducting plate for intimately contacting said flat surface of said reorientable heat source;
   a second heat conducting plate for intimately contacting said flat surface of said relatively fixed heat sink;
   a compressed spring element centrally located between said plates to bias said plates in intimate contact with said source and said sink; and
   a flexible heat conducting means surrounding said spring element and connected to said first and second heat conducting plates for defining said predetermined heat conducting path.

2. A compressible thermal interface assembly as in claim 1, wherein said spring element is a coil spring whereby said intimate contact of said plates to respective heat source and heat sink is maintained when said heat source is reoriented with respect to said heat sink.

3. A compressible thermal interface assembly as in claim 1, wherein said flexible heat conducting means is formed of a material selected from the group consisting of silver, gold, copper and beryllium.

4. A compressible thermal interface assembly as in claim 3, wherein said flexible heat conducting means is a cylindrical bellows formed from said selected material.

5. A compressible thermal interface assembly as in claim 3, wherein said flexible heat conducting means is a helical coil formed from said selected material.

6. In an infrared sensor comprising a relatively fixed refrigerated cold finger heat sink having a thermal conducting end face, and an infrared detector element mounted within a vacuum Dewar flask on a thermal conducting face for relative movement with respect to said thermal conducting end face, a thermal interface assembly which maintains a predetermined amount of thermal resistance in a thermal conduction path between said faces throughout a predetermined range of said relative movement between said faces, wherein said assembly comprises:
   a first heat conducting plate for intimately contacting said thermal conducting face on said vacuum flask;
   a second heat conducting plate for intimately contacting said thermal conducting end face of said heat sink;
   compressed spring means between said first and said second conducting plates to force said plates into said intimately contacting relationship with respect to said heat source and heat sink; and
   a flexible thermal conducting means surrounding said biasing means and connected to said first and second plates to provide a portion of said predetermined amount of thermal resistance between said first and second plates throughout said predetermined range of relative movement between said faces.

7. A thermal interface assembly as in claim 6, wherein said compressed spring means is a coil spring whereby said intimate contact of said first and second heat conducting plates to respective thermal conducting faces of said vacuum flask and said heat sink is maintained when said vacuum flask face is reoriented with respect to said heat sink face.

8. A thermal interface assembly as in claim 6, wherein said flexible thermal conducting means is formed of a material selected from the group consisting of silver, gold, copper and beryllium.

9. A thermal interface assembly as in claim 8, wherein said flexible thermal conducting means is a cylindrical bellows formed from said selected material.

10. A thermal interface assembly as in claim 8, wherein said flexible thermal conducting means is a helical coil formed from said selected material.

* * * * *

UNITED STATES PATENT AND TRADEMARK OFFICE
CERTIFICATE OF CORRECTION

PATENT NO. : 4,194,119
DATED : March 18, 1980
INVENTOR(S) : Ronald MacKenzie

It is certified that error appears in the above–identified patent and that said Letters Patent are hereby corrected as shown below:

Assignee designation cancel "Ford Motor Company" and substitute --Ford Aerospace & Communications Corporation--.

Signed and Sealed this

Fifteenth Day of July 1980

[SEAL]

Attest:

Attesting Officer

SIDNEY A. DIAMOND

Commissioner of Patents and Trademarks